United States Patent
Menkhoff et al.

[11] Patent Number: 6,137,349
[45] Date of Patent: Oct. 24, 2000

[54] FILTER COMBINATION FOR SAMPLING RATE CONVERSION

[75] Inventors: Andreas Menkhoff, Munich; Herbert Alrutz, Freiburg, both of Germany

[73] Assignee: Micronas Intermetall GmbH, Freiburg, Germany

[21] Appl. No.: 09/110,009

[22] Filed: Jul. 2, 1998

[30] Foreign Application Priority Data

Jul. 2, 1997 [EP] European Pat. Off. ............. 97110914

[51] Int. Cl.[7] .................................................. H03K 5/00
[52] U.S. Cl. ............................ 327/552; 341/61; 708/313
[58] Field of Search .................................. 327/551, 552, 327/100, 94; 375/242; 341/144, 155, 61; 708/312, 313

[56] References Cited

U.S. PATENT DOCUMENTS

| 4,748,578 | 5/1988 | Lagadec et al. ................... 708/313 |
| 5,712,635 | 1/1998 | Wilson et al. ...................... 341/144 |

FOREIGN PATENT DOCUMENTS 0052847  6/1982  European Pat. Off. .

OTHER PUBLICATIONS

Schussler, et al., "On Partly Digital Anti–Aliasing Filters", AFU, Band 36, pp. 349–355, 1982.
Ramstad, "Digital Methods for Conversion Between Arbitrary Sampling Frequencies", IEEE Transactions on Acoustics, Speech, and Signal Processing, vol. ASSP–32, No. 3, pp. 577–591, Jun. 1984.
Chu, et al., "Multirate Filter Designs Using Comb Filters", IEEE Transactions on Circuits and Systems, vol. CAS–31, No. 11, pp. 913–924, Nov. 1984.
Copy of European Search Report for EP 97 11 0914, dated Feb. 12, 1998.

*Primary Examiner*—Dinh T. Le
*Attorney, Agent, or Firm*—Arthur L. Plevy; Buchanan Ingersoll PC

[57] ABSTRACT

A filter combination for sampling rate conversion is disclosed comprising a series combination of: an input low-pass filter (1) whose attenuation characteristic (tp1) has at least one first attenuation value (a1) in the vicinity of one-half and 1.5 times the frequency of a digitization clock (f1); a time-invariant interpolation filter (2) for increasing the number of samples from that of the first data sequence (d1) by an integral factor whose attenuation characteristic (tp2) has at least one second attenuation value (a2) in the vicinity of the frequency of the digitization clock (f1) and essentially at least one third attenuation value (a3) in the region between one-half and 1.5 times the frequency of the digitization clock; and a time-varying interpolation filter (3) for interpolating a data sequence (d5) provided at the output of the time-invariant interpolation filter (2), the attenuation characteristic (tp3) of the time-varying interpolation filter (3) having at least one fourth attenuation value (a4) in the vicinity of twice the frequency of the digitization clock (f1).

20 Claims, 2 Drawing Sheets

fraud…

FILTER COMBINATION FOR SAMPLING RATE CONVERSION

FIELD OF THE INVENTION

This invention relates to a filter combination for converting the sampling rate of a digitized signal.

BACKGROUND OF THE INVENTION

In the field of communications and signal processing, it is well known that an original sampling rate for sampling a signal must satisfy the sampling theorem, which states that the signal to be digitized is band-limited and has an upper cutoff frequency which is less than half the sampling rate. To obtain a sampling-rate increase or reduction by arbitrary factors, filter combinations have proved to be effective, which are also referred to as "hybrid systems". The basic idea is that the low-pass-filtered input data sequence is converted into an analog signal which is then digitized again at the desired sampling rate. In intermediate stages, of course, digital and analog low-pass filtering is performed whose cutoff frequencies are matched to the respective internal and external sampling rates and signal frequencies, so that no aliasing will occur in the output data sequence.

Reconstructing an analog signal within the filter combination by digital-to-analog conversion is possible in principle, but this approach serves mainly to explain the method. For the actual implementation, complete reconstruction of the analog signal is not necessary, since the desired intermediate values can be calculated with a high degree of accuracy by all-digital means via an interpolation of the digital samples. Conversion into an analog signal would be an unnecessary and roundabout way, since for sampling rate conversion, only a single intermediate value between fixed, given values has to be interpolated for each new sample. The analog signal waveform on both sides of this interpolated intermediate value is not needed for the output data sequence. The given values may be actual and/or interpolated samples; in any case, they are defined by a fixed sampling sequence. Therefore, the filter which provides the given values is also referred to as a fixed or time-invariant interpolation filter. As a rule, the frequency of this new sampling sequence is higher than the original sampling frequency by a power of two. Such filter combinations are exhaustively described, for example, in an article by T. A. Ramstad, "Digital Methods for Conversion Between Arbitrary Sampling Frequencies", IEEE Transactions on Acoustics, Speech, and Signal Processing, Vol. ASSP-32, No. 3, June 1984.

Co-pending, commonly assigned U.S. patent application Ser. No. 08/984735 entitled "DIGITAL FILTER COMBINATION FOR INTERPOLATION" filed on Dec. 3, 1997 and incorporated herein by reference discloses a digital filter combination for interpolating samples of a digitized signal whereby the sampling rate of digitized video or audio signals can be changed by an arbitrary numerical ratio. The circuit includes a third-order time-invariant interpolation filter with which the number of existing samples is doubled by forming interpolated intermediate values. Two samples are assigned to one period of the original sampling clock. For the further processing, this is tantamount to a doubling of the original sampling rate, since the available samples now correspond to a sampling sequence with one-half the original period. The time-invariant interpolation filter is followed by a second-order time-varying interpolation filter which can calculate intermediate values from the new sampling sequence for the desired output sequence for any points of time.

If the sampling rates at the input and output ends are similar to each other, the filter complexity will remain within reasonable limits. Things are different if the two sampling rates differ widely, because the mirroring of the existing signal spectrum at the new sampling rate and the associated frequency multiples may result in aliasing. The suppression of these frequency components in the signal spectrum, which is generally carried out prior to the sampling rate conversion, requires complex low-pass filters, such as transversal filters with long delay cascades. The band limiting becomes even more complex if the bandwidth must be adjustable in several steps because the sampling-rate ratio must be arbitrarily adjustable within given limits. The band limiting may thus become much more complex than the sampling rate conversion proper. For consumer applications, the complexity involved in implementing a particular function is an important quantity: the higher the circuit complexity, the greater the amount of semiconductor area required for this function during monolithic integration. As is well known, the increased semiconductor area requirement enters disproportionately into the manufacturing costs.

It is therefore an object of the invention to keep the overall circuit complexity for arbitrary sampling rate conversion to a minimum.

SUMMARY OF THE INVENTION

This object is attained by a filter combination according to the features of the present claims. The basic idea of the invention is to merge the circuit for providing band limiting and the circuit for performing sampling rate conversion. The sampling rate conversion and the band limiting associated therewith are achieved by interaction of filter stages. The invention takes advantage of the fact that it is not only the passband and stopband of the input low-pass filter which determine the necessary band limiting, but that with an appropriate combination of the filters involved in the sampling rate conversion, the requirement placed on the individual filter can be reduced since the resulting common frequency response provides sufficient overall signal attenuation in the frequency range of interest. The duplicated portions of the frequency response curves are also included in order to suppress interfering frequencies and frequency multiples. Only those interfering frequencies need to be taken into account which can actually occur in the respective system and are not already suppressed by the basic properties of the circuit technology, the reproducing device, or, for example, the viewer. The necessary signal attenuation also depends on the subjective sensitivity to interference, which is lower in the case of video signals than in the case of audio signals.

The filter combination according to the invention can be used to adapt the processing clock frequency of the digitized signal to the actual signal bandwidth. This is necessary, for example, if oversampling takes place or a relatively narrowband signal is contained in the broadband composite signal. The sampling rate conversion, however, may also change, e.g., compress or expand, the signal content. With the compression, the amount of storage needed for storing signals can be reduced. The invention permits an adaptation of different sampling rates of signals, e.g., the adaptation of a data sequence synchronized with a fixed clock to the predetermined system clock of another processing system. In the case of video signals, a change in the size of the respective image on the screen of a television receiver or a multimedia reproducer, particularly a reduction of the image size, is possible. In this manner, still images, moving television images, images produced with a computer, or images of other image sources can be presented in a screen window in arbitrarily reduced form. These on-screen displays can also serve as menu fields.

The filter combination according to the invention includes an input low-pass filter which has sufficient attenuation in the vicinity of one-half and 1.5 times the sampling frequency. This filter is followed by the hybrid filter system, consisting of a time-invariant interpolation filter and a time-varying interpolation filter. The hybrid filter system has a high attenuation in the vicinity of the sampling frequency and twice the sampling frequency. The attenuation characteristic between half the sampling frequency and 1.5 times the sampling frequency and in the associated periodic duplication regions is lower, but sufficient as a whole. High attenuation values in particular frequency ranges can be realized by single or multiple zeros of the transfer functions. The frequency ranges of these stopbands depend on the course of the transfer function, particularly on the number of zeros in this frequency range, and the desired attenuation. With the time-varying interpolation filter, interpolation within one octave is generally implemented. For greater changes of the sampling frequency, the signal then passes through a decimator with an associated low-pass filter, which is then incorporated into the filter combination. Advantageously, a reduction in circuit complexity is obtained if the integral decimation factor is a variable power of 2, because then the gain of the decimator can be neutralized by a simple arithmetic shift or a new bit allocation of the output data.

BRIEF DESCRIPTION OF THE DRAWINGS

The invention and a preferred embodiment will now be described in more detail with reference to the accompanying drawings, in which.

DETAILED DESCRIPTION OF THE INVENTION

Figure 1:
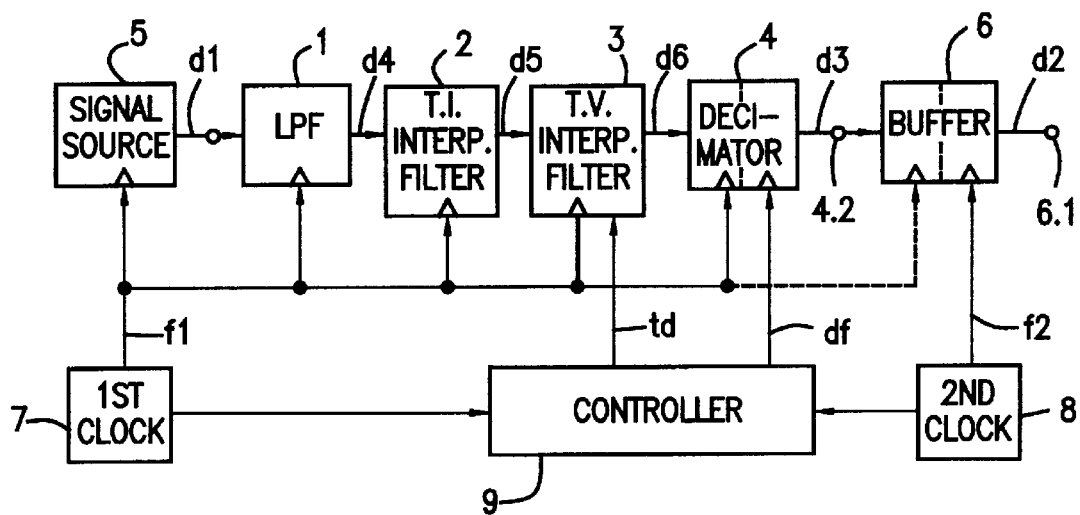
FIG. 1 is a schematic block diagram of a facility for performing sampling rate conversion with a filter combination according to the invention.

FIG. 1 shows a circuit for performing sampling rate conversion with a filter combination 1, 2, 3 according to the invention which was expanded by adding a decimator 4. The expanded filter combination is interposed between a signal source 5 and a buffer 6 whose output 6.1 provides an output data sequence d2 at the desired sampling frequency f2. Connected to the signal source 5 is a first clock source 7 which provides a first clock signal f1. The latter also serves as a digitization clock or input clock and thus determines the data rate of an input data sequence d1. A second clock source 8 provides a second clock signal f2, the output clock, and, like the first clock source 7, is connected to a controller 9.

The filter combination includes an input low-pass filter 1 whose attenuation characteristic tp1 is implemented, for example, with a second-order low-pass filter with the transfer function $H(z)=(1+z^{-1})^2$. This low-pass filter 1 has a double zero in the vicinity of one-half the sampling frequency, $0.5 \times f1$, and thus also at 1.5 times the sampling frequency. The passband and attenuation characteristic is "soft", so that signals are attenuated already from 0.2 times the frequency of the sampling clock f1. The attenuation at the zero has at least the value a1 for a major frequency range, see FIG. 2. The output of the input low-pass filter 1 provides a data sequence d4.

The input low-pass filter 1 is followed by a time-invariant interpolation filter 2, which is frequently also referred to as a half-band filter. With the aid of this filter, the number of samples of the input data sequence d1 is doubled by interpolation. The new sampling sequence is passed as a data sequence d5 to the subsequent time-varying interpolation filter 3, with part of the values being available in parallel as given values—the processing clock is determined by the first clock signal f1. Simultaneous doubling of the processing clock frequency is appropriate where such an increase is easily possible, e.g., because the data rate of the data sequence d1 is substantially lower than the system clock rate.

Figure 2:
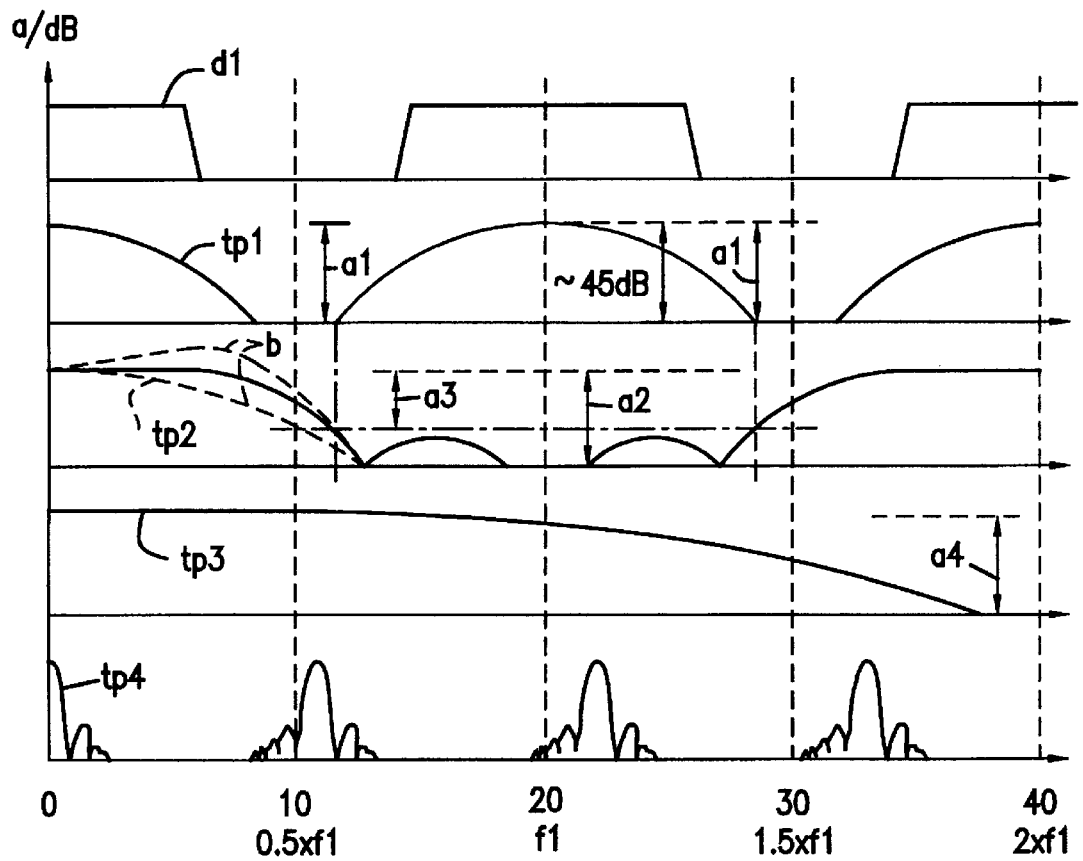
FIG. 2 shows the frequency responses of the individual filters.

The time-invariant interpolation filter 2 contains a low-pass filter whose frequency response curve tp2 is such that in the vicinity of the sampling frequency f1, at least one double zero with the attenuation a2 (FIG. 2) is present, and that from approximately one-half to 1.5 times the sampling frequency, the attenuation has at least the value a3 (FIG. 2). The time-invariant interpolation filter 2 may be designed so that the undesired attenuation of higher signal frequencies by the input low-pass filter 1 is compensated for by a certain high-frequency accentuation. For the input data sequence d1, the combination of input low-pass filter 1 and interpolation filter 2 forms a resultant low-pass filter whose stopband begins slightly below one-half the sampling frequency, $0.5 \times f1$, and extends to slightly beyond 1.5 times the sampling frequency. Through frequency duplication, this repeats itself between 2.5 times and 3.5 times the sampling frequency and at correspondingly higher frequencies.

At a sampling frequency f1 of 20 MHZ, the signal components located at twice the sampling frequency, $2 \times f1$, are generally also disturbing. These signal components are suppressed by means of the characteristics of the time-varying interpolation filter 3, which follows the time-invariant interpolation filter 2. The interpolation assigned to arbitrary time values takes place in this time-varying interpolation filter 3, whose input is fed with the given values from the time-invariant interpolation filter 2. The output of the time-varying interpolation filter 3 is a data sequence d6 whose values are delivered in synchronism with the first clock f1. As a rule, locking of the data sequence d6 to the output clock f2 does not yet take place in the time-varying interpolation filter 3.

Figure 5:
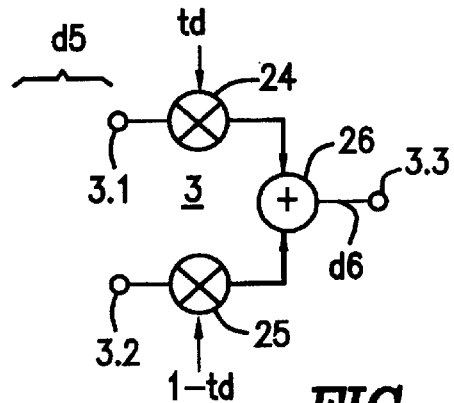
FIG. 5 is a block diagram of a linear interpolation filter.

In the simplest case, the time-varying interpolation filter 3 is implemented with a linear interpolator (see FIG. 5). Its frequency response tp3 corresponds to a low-pass characteristic and has a zero at twice the sampling frequency, $2 \times f1$, which has at least the attenuation value a4 in the region of this zero (FIG. 2). For the intended suppression of the interfering frequencies, this is sufficient; improvements can be achieved with higher-order interpolators. The instant of interpolation is determined by the controller 9, which provides a corresponding time-difference signal td for each sample to be interpolated. The respective time-difference signal td is calculated based on a temporal evaluation of the two clocks f1, f2 which includes the nearest given values.

Since such sampling-rate-converting circuits generally perform a substantial sampling-rate reduction, the filter combination 1, 2, 3 is followed by the aforementioned decimator 4, with which a sampling-rate reduction by an integral factor, particularly by a power of 2, can be implemented. Especially suited for such circuits are first- or higher-order MTA (moving time averager) filters because of their simple design. The low-pass filter in the decimator 4 is dependent on the respective decimation factor df, which defines a tracking data window that serves to average weighted or unweighted samples, depending on the order of the filter. At a decimation factor of 1, the circuit 4 is ineffective. As a rule, the respective integral decimation factor df is determined by the controller 9. The data sequence d3 at the terminal 4.2 is synchronized with the first clock signal f1. Compensation for the time difference from the second clock f2 is provided by the buffer 6, whose two control inputs are connected to the first clock source 7 and the second clock source 8, respectively. As long as the temporal control range of the interpolator 3 does not exceed one octave, no clock overlapping problems will arise. It is also possible to place the buffer 6 between the time-varying interpolation filter 3 and the decimator 4, in which case the clock control of the decimator 4 can also be synchronized with the second clock source 8.

The individual functional units of the circuit shown in FIG. 1 in block-diagram form can also be implemented, in whole or in part, with a fast processor and associated programs, of course. A numerical example shows how the change of the sampling rate is divided among the elements of the filter combination. If the sampling frequency is to be changed by a factor of 7.34, the hybrid system will perform a sampling rate conversion by a factor of 0.9175 and the decimator will reduce the sampling rate by a factor of 8. The hybrid system will first double the sampling rate (strictly speaking, only the number of samples will be doubled, not the sampling rate proper, see above) and then form the reduction factor 1.835 via the time-difference signal td.

FIG. 2 shows the frequency scheme a/dB of a few signals of FIG. 1. The sampling frequency f1 is 20.25 MHZ. The input data sequence d1 corresponds to a video signal whose upper cutoff frequency is approximately 6 MHZ. The next line shows the soft frequency response tp1 of the input low-pass filter 1. The upper frequencies of the video signal d1, from approximately 2.5 MHZ, are already reduced in amplitude. The third line shows the frequency response tp2 of the low-pass filter in the time-invariant interpolation filter 2. The increase or reduction of the magnitude of higher frequency components corresponds to the course of the dashed line b in the passband. The fourth line shows the frequency response tp3 of a linear interpolator 3 whose two inputs are fed with adjacent samples from the time-invariant interpolation filter 2.

The attenuation characteristics a/dB of the curves in FIG. 2 correspond to a logarithmic representation and represent a range of approximately 45 dB for each curve. The fifth line in FIG. 2 shows the frequency response of the overall filter combination after the decimator 4. The set value of the sampling-rate reduction in the hybrid interpolation filter 2, 3 and in the decimator 4 enters into this frequency response. For the example shown it is assumed that an interpolated sampling frequency of 11 MHZ is present at the output of the time-varying interpolation filter 3 and that this frequency is then reduced by a factor of 8 in the decimator 4. The frequency response tp4 thus corresponds to a sampling-rate reduction by a factor of 14.7, at which all frequencies above approximately 0.7 MHZ must be suppressed in the input data sequence d1; this is implemented with the filter combination 1, 2, 3, 4. This narrow-band low-pass characteristic is present in the passband of the frequency response curve tp4. The secondary maxima of the frequency response curve tp4 correspond to the theoretical frequency response of an MTA decimator whose input data sequence has a frequency of 11 MHZ and whose decimation factor df=8. In the case of video signals, these secondary maxima are not disturbing. If the attenuation is not sufficient there, only a higher-order MTA filter needs to be used. The regions with the frequency multiples of 11 MHZ are sufficiently attenuated by the expanded filter combination 1, 2, 3, 4, so that they are negligible for the output data sequence d2. As a result of the mirror-like symmetry of the frequency response curves tp1 to tp3 about the sampling frequency f1 and multiples thereof, possible interfering frequencies above the sampling frequency are also suppressed.

Figure 3:
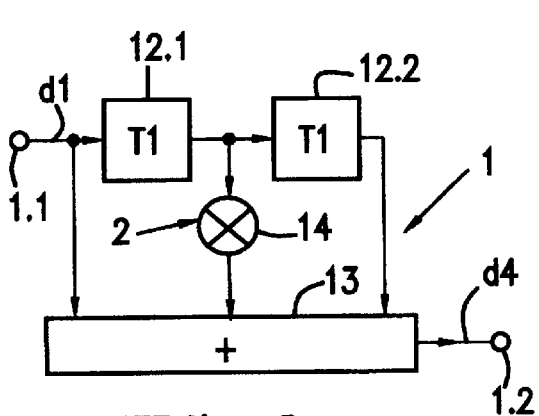
FIG. 3 is a block diagram of a simple low-pass filter.

FIG. 3 shows an example of an input low-pass filter 1 whose attenuation characteristic corresponds to that of a second-order low-pass filter and which has the transfer function $H(z)=(1+z^{-1})^2$. The circuit includes two series-connected delay stages 12.1, 12.2 whose respective delays T1 are equal to the period of the first clock signal f1. The three taps at the delay cascade are connected to a summing stage 13, with the signal of the center tap being applied through a multiplier 14 which weights it with the factor 2.

Figure 4:
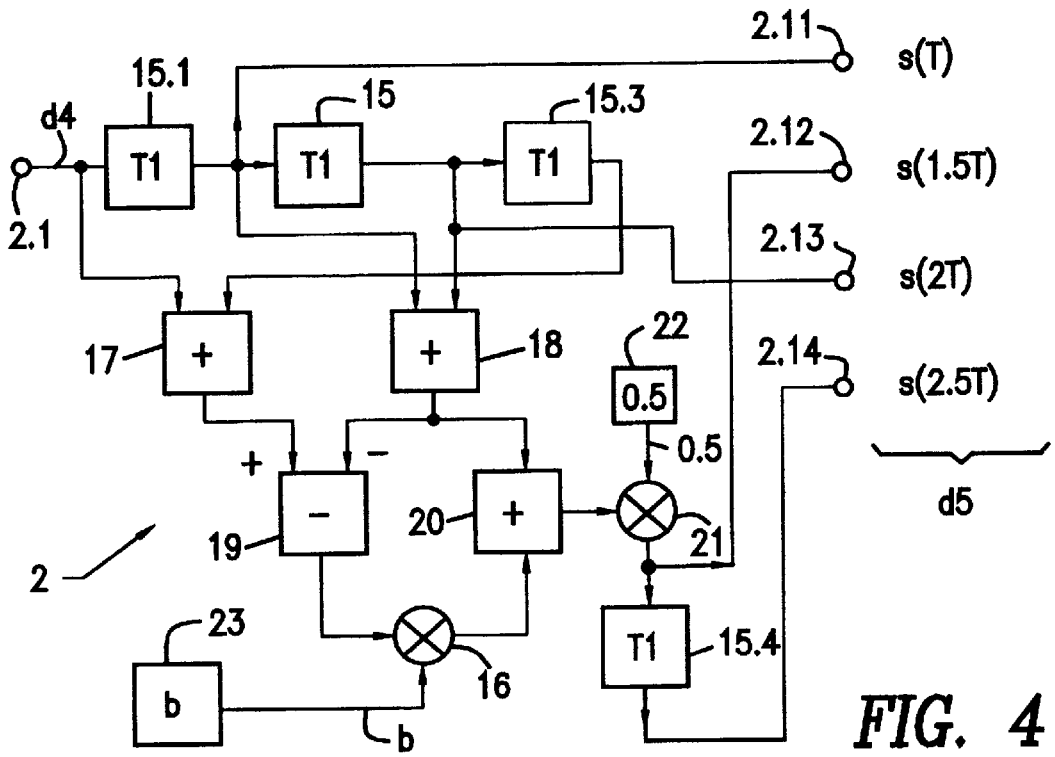
FIG. 4 is a block diagram of a time-invariant interpolation filter.

An example of the time-invariant interpolation filter 2 is shown in FIG. 4. It includes a cascade of three delay stages 15.1, 15.2, 15.3 whose respective delays T1 are equal to the period of the first clock signal f1. By differently combining the samples tapped at the delay cascade, the individual frequency components for forming given values or samples s(T), s(1.5T), s(2T), and s(2.5T) are obtained. The embodiment of the time-invariant interpolation filter 2 shown in FIG. 1 has the advantage of requiring only a single genuine multiplier, four delay stages, and four adder/subtracters. The circuit configuration with the three-stage delay cascade corresponds to a third-order time-invariant interpolation filter.

The filter coefficients of this time-invariant interpolation filter 2 do not change, since the required samples are fixed in time with respect to the original sampling sequence, hence the designation "time-invariant interpolation filter". By contrast, the filter coefficients of the time-varying interpolation filter 3 are dependent on the respective value of the time-difference signal td, hence the designation "time-varying interpolation filter".

In the circuit example of FIG. 4, the input 2.1 of the first delay stage 15.1 is connected to the first input of an adder 17. The output of this delay stage is coupled to the first input of an adder 18 having its second input connected to the input of the third delay stage 15.3, whose output is coupled to the second input of the first adder 17. The outputs of the first adder 17 and the second adder 18 are connected, respectively, to the minuend and subtrahend inputs of a subtracter 19 whose output is coupled through a multiplier 16 to the first input of a third adder 20. The second input of this adder is connected to the output of the second adder 18, and its output is connected through a shift stage 21 to an output 2.12 and a delay stage 15.4. The shift stage 21 halves the output value of the third adder 20 and corresponds to a multiplier which is supplied with a multiplication factor of 0.5 from a memory 22. The multiplier 16 is a genuine multiplier which changes the value of the signal component from the subtracter 19. This signal component corresponds to a higher frequency range of the data sequence applied at the terminal 2.1. It is attenuated or amplified by a multiplication factor b read from a memory 23, and added to the filtered signal by means of the third adder 20. The multiplication factor b thus represents a filter coefficient whose control range extends from −3/8 to −1/8. The filter coefficient b causes the frequency response curve to be raised or lowered for higher frequencies, cf. the dashed curve b in the frequency diagram tp2 of FIG. 2.

With the filter circuit of FIG. 4, four given values s(T) to s(2.5T) can be determined which can be tapped simultaneously and correspond to samples that are spaced one-half of the period T1 of the input clock f1 apart. The output of the first delay stage 15.1 forms the first output terminal 2.11, the output of the shift stage 21 forms the second output signal 2.12, the output of the second delay stage 15.2 forms the third output terminal 2.13, and the output of the fourth delay stage 15.4 forms the fourth output terminal 2.14. If the subsequent time-varying interpolation filter 3 requires more given values, these can be produced with similar circuits. If the subsequent time-varying interpolation filter 3 performs just a linear interpolation, only the output terminals 2.11 to 2.13 of the filter arrangement of FIG. 4 are needed. A selection circuit then determines for which pair of samples s(T), s(1.5T) or s(1.5T), s(2T) the time-difference signal dt is smallest, and selects this pair of samples for the subsequent interpolation.

FIG. 5 shows schematically a linear interpolator 3 which, according to the time-difference signal dt, performs an arbitrary interpolation between two samples applied to it at first and second terminals 3.1 and 3.2, respectively. Each of the applied samples is weighted by means of a weighting device 24, 25 in accordance with the time-difference signal td. The time-difference signal td determines what linear share the first and second samples have in the output value. A multiplier 24 multiplies the first sample at the terminal 3.1 by the time-difference signal td, and a multiplier 25 multiplies the second sample at the terminal 3.2 by the factor 1−td. An adder 28 adds the two resulting values, and the sum at its output 3.3 is the linearly interpolated sample. The time-difference signal td is the numerical value normalized to one half-period ½×T1 of the clock signal f1.

Figure 6:
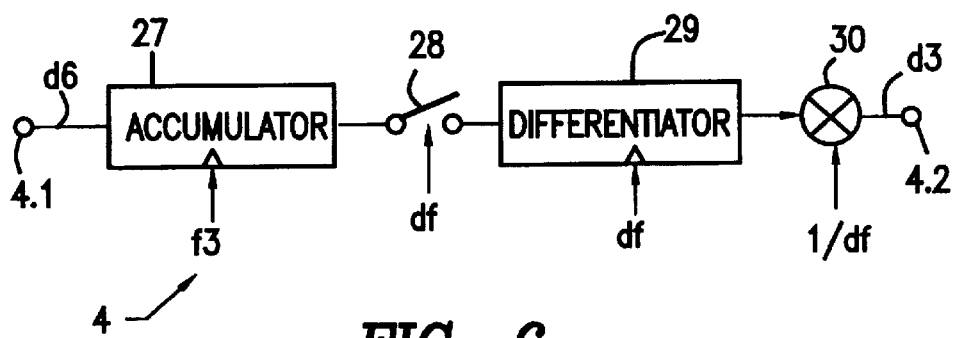
FIG. 6 is a block diagram of an MTA decimator.

FIG. 6 shows a schematic block diagram of an MTA decimator 4. In the simplest case, this MTA decimator contains an accumulator 27, a decimation switch 28, and a differentiator 29. In higher-order MTA decimators, a given number of accumulators 27 and an equal number of differentiators 29 are connected in series. The accumulators are controlled by the first clock signal f1, and the differentiators and the decimation switch 28 by the decimation clock signal df. The data sequence applied at the input 4.1 is added up in the accumulator 27. After a given number of samples, the accumulator contents are transferred by means of the decimation switch 28 into the differentiator 29, which subtracts the accumulator contents stored therein, i.e., those accumulator contents which were assigned to the preceding instant of decimation, from the value transferred to it. The operation of the decimator 4 thus corresponds to that of an averager which averages over a number of samples that is defined by a tracking data window whose length is dependent on the decimation factor df. Because of the amplifying property of the MTA filter, the averaging requires a normalizing device after the accumulator 27 or the differentiator 29. If the decimation factor df is a power of two, a simple arithmetic shift or a new bit allocation will be sufficient for the normalization. In any case, the required samples of the output data sequence d2 should be available at the output 4.2 with the correct amplitude.

What is claimed is:

1. A filter combination circuit for performing a sampling rate conversion of an input data sequence (d1) into an output data sequence, comprising:

an input low-pass filter (1) receiving said input data sequence (d1) for outputting a first data sequence (d4) in response to a digitization clock frequency of a clock signal (f1), said input low-pass filter having an attenuation characteristic (tp1) of at least one first attenuation value (a1) substantially corresponding to between one-half and 1.5 times digitization clock frequency (f1);

a time-invariant interpolation filter (2) responsive to said first data sequence (d4) of said input low-pass filter and said digitization clock frequency (fi) for increasing a number of samples from that of the input data sequence (d1) by an integral factor to provide a second data sequence (d5), and having an attenuation characteristic (tp2) comprising at least one second attenuation value (a2) substantially corresponding to the frequency of the digitization clock (f1) and at least one third attenuation value (a3) substantially corresponding to the between one-half and 1.5 times the frequency of the digitization clock; and a time-varying interpolation filter (3) for interpolating said second data sequence (d5) provided at an output of the time-invariant interpolation filter (2), in response to said clock signal for suppressing signal components at twice the frequency of the digitization clock (f1) to provide said output data sequence, said time-varying filter having an attenuation characteristic (tp3) of at least one fourth attenuation value (a4) substantially corresponding to twice the frequency of the clock signal (f1);

wherein, said input low pass filter (1), time-invariant interpolation filter (2) and time-variant interpolation filter (3) are coupled in series.

2. The filter combination circuit as claimed in claim 1, further comprising a decimator responsive to an output of said time-varying interpolation filter (3) for reducing a sampling rate or a number of samples of said output data sequence by an integral decimation factor (df).

3. The filter combination circuit as claimed in claim 1, wherein said input low-pass filter (1) is defined by a transfer function H(z)=(1+z⁻¹)ᵖ, where p is a coefficient and greater than or equal to 2.

4. The filter combination circuit as claimed claim 1, wherein said time-invariant interpolation filter (2) has a frequency response corresponding to said attenuation characteristic (tp2) which is adjustable in a passband for higher frequencies in response to an applied coefficient (b).

5. The filter combination as claimed in claim 1, wherein the time-varying interpolation filter (3) comprises a linear interpolator circuit for implementing a linear interpolation.

6. The filter combination as claimed in claim 2, wherein said decimator (4) comprises a mean time averaging (MTA) filter structure.

7. The filter combination as claimed in claim 6, wherein said integral decimation factor (df) is a power of two.

8. The filter combination as claimed in claim 2, wherein said decimator includes an arithmetic shift unit for effecting amplitude normalization of said output data sequence.

9. The filter combination circuit according to claim 1, wherein said integral factor for increasing a number of samples from that of the input data sequence (d1) in said time invariant interpolation filter is a factor of 2.

10. A method for performing a sampling rate conversion of an input data sequence (d1) into an output data sequence (d2) comprising the steps of:

low-pass filtering said input data sequence (d1) using a second order low-pass filter having a transfer function hz=(1−z⁻¹)² and having an attenuation characteristic of at least one first attenuation value substantially corresponding to between one half and 1.5 times a sampling frequency (f1) of a first clock signal to provide a first data sequence (d4);

doubling the number of samples of said input data sequence (d1) by filtering said first data sequence (d4) using a time invariant interpolation filter to provide a second data sequence (d5) corresponding to said first clock signal;

performing a time-varying interpolation of said second data sequence (d5) using a linear interpolator having at least one attenuation value (a4) substantially corresponding to twice the sampling frequency (f1) to produce a third data sequence (d6);

reducing the sampling rate of said third data sequence (d6) by an integral factor greater than 1 to produce a fourth data sequence (d3), and buffering said fourth data sequence (d3) according to said sampling frequency (f1) and a second clock signal (f2) for providing said output data sequence at a sampling rate corresponding to said second clock signal (f2).

11. The method according to claim 10, further comprising the step of controlling said first and second sampling frequencies (f1, f2) by means of a controller.

12. The method according to claim 11, further comprising the step of providing a corresponding time difference signal (td) for each sample to be interpolated by said time-varying interpolation filter for controlling an instant of interpolation.

13. The method according to claim 12, wherein said respective time difference signal (td) is determined based on a temporal evaluation of said first and second clock sampling frequencies (f1) and (f2).

14. The method according to claim 13, wherein the step of reducing the sampling rate by an integral factor greater than 1 further comprises the step of reducing said sampling rate by a power of 2.

15. The method according to claim 14, wherein the step of reducing the sampling rate by an integral factor greater than 1 further comprises the step of performing mean time averaging of said third data sequence (d6).

16. A filter combination circuit for performing a sampling rate conversion of an input data sequence (d1) into an output data sequence, comprising:

an input low-pass filter (1) for receiving said input data sequence and providing a first data sequence (d4), said input low-pass filter having an attenuation characteristic (tp1) of at least one first attenuation value (a1) substantially corresponding to between one-half and 1.5 times a digitization clock frequency (f1) of a first clock signal;

a time-invariant interpolation filter (2) responsive to said first data sequence (d4) for increasing a number of samples from that of the input data sequence (d1) by an integral factor to provide a second data sequence (d5), and having an attenuation characteristic (tp2) comprising at least one second attenuation value (a2) substantially corresponding to the frequency of the first clock signal (f1) and at least one third attenuation value (a3) substantially corresponding to between one-half and 1.5 times the frequency of the first clock signal (f1);

a time-varying interpolation filter (3) coupled to said time-invariant filter for interpolating said second data sequence (d5) provided at an output of the time-invariant interpolation filter (2), for suppressing signal components at twice the frequency of the first clock signal (f1) to provide a third data sequence (d6), said time-varying filter having an attenuation characteristic (tp3) of at least one fourth attenuation value (a4) substantially corresponding to twice the frequency of the first clock signal (f1);

a decimator responsive to said third data sequence (d6) for reducing a sampling rate or a number of samples of said output data sequence by an integral decimation factor (df) and provide a fourth data sequence (d3); and, a buffer responsive to said fourth data sequence (d3) and to a second clock signal (f2) for outputting said output data sequence at a sampling rate corresponding to said second clock signal (f2).

17. The circuit according to claim 16, further comprising a controller coupled to said clocks for receiving said first and second clock signals (f1) and (f2).

18. The circuit according to claim 17, wherein said controller operates to provide a corresponding time difference signal (td) for each sample to be interpolated by said time-varying interpolation filter to control an instant of interpolation.

19. The circuit according to claim 18, wherein said controller is operable to provide a decimation factor signal (df) to said decimator to define a tracking data window for averaging weighted or unweighted samples.

20. The circuit according to claim 19, wherein said fourth data sequence (d3) output from said decimator is synchronized with said first clock signal (f1) and where said buffer receiving said fourth data sequence (d3) operates to compensate for a time difference between said first clock signal and said second clock signal.

* * * * *